(12) United States Patent
Lin et al.

(10) Patent No.: US 8,400,860 B2
(45) Date of Patent: Mar. 19, 2013

(54) ELECTRICAL FUSE MEMORY

(75) Inventors: Sung-Chieh Lin, Zhubei (TW); David Yen, Chu-Bak (TW); Wei-Li Liao, Taichung (TW); Jiann-Tseng Huang, Hsinchu (TW); Kuoyuan (Peter) Hsu, San Jose, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 189 days.

(21) Appl. No.: 12/839,542

(22) Filed: Jul. 20, 2010

(65) Prior Publication Data
US 2012/0020177 A1    Jan. 26, 2012

(51) Int. Cl.
*G11C 17/16* (2006.01)
(52) U.S. Cl. ..................... 365/225.7
(58) Field of Classification Search .............. None
See application file for complete search history.

(56) References Cited

U.S. PATENT DOCUMENTS

| | | | |
|---|---|---|---|
| 6,227,637 B1 * | 5/2001 | Phan | 327/525 |
| 6,324,093 B1 * | 11/2001 | Perner et al. | 365/171 |
| 2009/0201074 A1 * | 8/2009 | Aipperspach et al. | 327/524 |
| 2009/0201713 A1 * | 8/2009 | Shin et al. | 365/96 |

* cited by examiner

*Primary Examiner* — Hoai V Ho
*Assistant Examiner* — James G Norman
(74) *Attorney, Agent, or Firm* — Lowe Hauptman Ham & Berner, LLP

(57) ABSTRACT

Some embodiments regard a memory array that has a plurality of rows and columns. A column includes a program control device, a plurality of eFuse memory cells in the column, a sense amplifier, and a bit line coupling the program control device, the plurality of memory cells in the column, and the sense amplifier. A row includes a plurality of eFuse memory cells in the row, a word line coupling the plurality of eFuse memory cells in the row, and a footer configured as a current path for the plurality of eFuse memory cells in the row.

20 Claims, 4 Drawing Sheets

Fig. 3    300

ELECTRICAL FUSE MEMORY

TECHNICAL FIELD

The present disclosure is generally related to electrical fuses (eFuses), and particularly, to memories using eFuse bit cells.

BACKGROUND

In the semiconductor manufacturing processes, the process node has transitioned from 90 nanometers (nm) down to 60 nm, to 40 nm, to 28 nm, etc., wherein the size of transistors is reduced for higher capacities. Electrical fuse (eFuse) bit cells used in memories/memory arrays are no exception to the size reduction transition, i.e., their size also continues to decrease.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
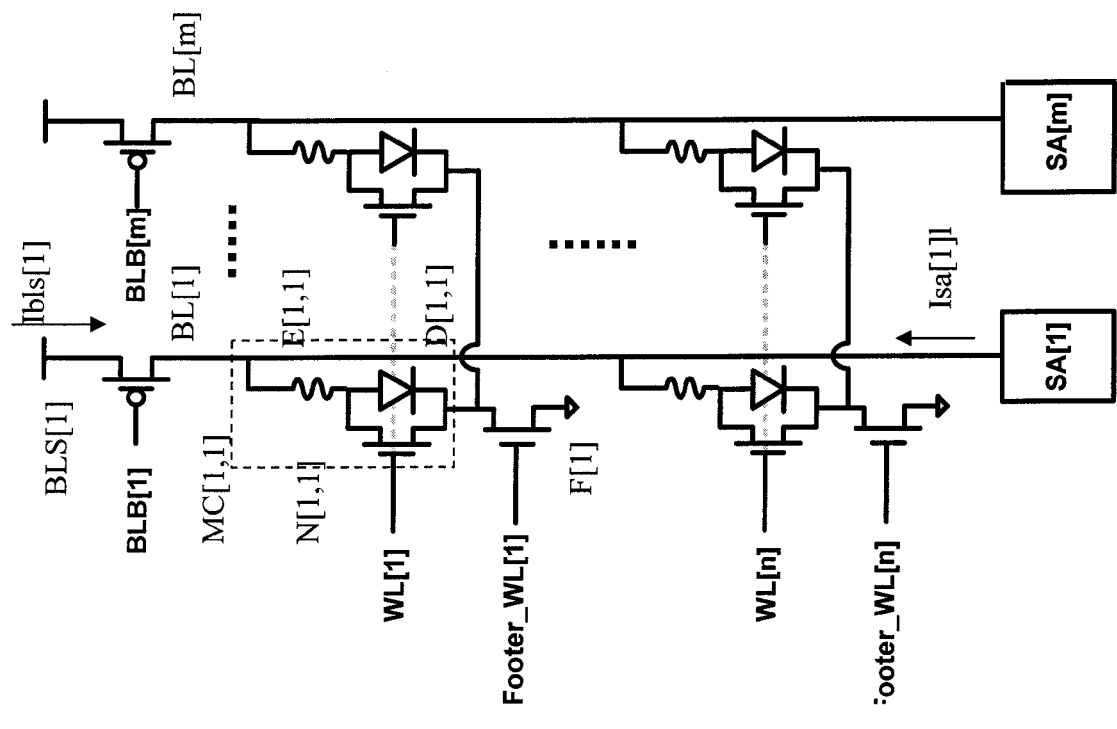
FIG. 1 is a diagram of the memory array of bit cell eFuses, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art. Reference numbers may be repeated throughout the embodiments, but they do not require that feature(s) of one embodiment apply to another embodiment, even if they share the same reference number.

Exemplary Circuit

FIG. 1 is a diagram of an eFuse memory array 100, in accordance with some embodiments. For illustration, memory array 100 includes m columns and n rows of eFuse memory cells MC (e.g., bit cells MC) associated with m bit lines BL (e.g., bit line BL[1] to bit line BL[m]) and n word lines WL (e.g., word line WL[1] to word line WL[n]). In some embodiments, memory array 100 is a 64×64 cell array (e.g., m=n=64), but the embodiments contemplated by the inventors are not so limited, m and n can be any positive number.

Each bit line BL (e.g., bit line BL[1]) is coupled to the drain of a corresponding transistor BLS (e.g., transistor BLS[1]), and is associated with n memory cells (e.g., memory cells MC[1,1] to MC[n,1]) and a sense amplifier SA (e.g., sense amplifier SA[1]).

A transistor BLS is commonly called a bit line select transistor, a program control device, a control device, etc. A signal BLB controls a corresponding transistor BLS. For example, when a signal BLB (e.g., signal BLB[1]) is activated (e.g., driven with a high logic (a High)), it turns on the corresponding transistor BLS (e.g., transistor BLS[1]), and when it is de-activated (e.g., driven with a low logic (a Low)), it turns off the corresponding transistor BLS. In some embodiments, a transistor BLS (e.g., transistor BLS[1]) is turned on to generate a current (e.g., current Ibsl[1]) to program a memory cell MC on the corresponding bit line (e.g., bit line BL[1]) and is turned off when a memory cell MC on the bit line is read.

In some embodiments, a memory cell MC includes an eFuse E, a diode D, and an NMOS transistor N. For illustration, only details of memory cell MC[1,1] are shown that includes an eFuse E[1,1], a diode D[1,1], and an NMOS transistor N[1,1], and the below illustrative description is based on memory cell MC[1,1]. The operation of other memory cells MC is similar to that of memory cell MC[1,1]. eFuse E[1,1] is coupled in series with transistor N[1,1] that is coupled in parallel with diode D[1,1]. An eFuse E generally includes two logic states, e.g., a Low and a High. In some embodiments, an eFuse E is Low when its resistance is Low and is High when its resistance is High. Further, if R represents the resistance of an eFuse E, the eFuse E is Low if R is less than about 100 Ohm, and is High if R is higher than about 10K Ohm (e.g., the eFuse E is an open circuit). In some embodiments, the eFuses E in memory array 100 are Low after memory array 100 is manufactured and an eFuse E is High after it is programmed. Further, the logic level of an eFuse E represents the data logic of the corresponding memory cell MC. For example, if an eFuse (e.g., eFuse E[1,1]) is Low then memory cell MC[1,1] is considered as storing a Low, but if eFuse E[1,1] is High, then memory cell MC[1,1] is considered as storing a High. To determine the logic state or the data of a memory cell MC, the data is detected at the corresponding bit line. For example, to read the data from memory cell M[1,1], if bit line BL[1], at the time of reading, is detected High then the data of memory cell M[1,1] is High, but if bit line BL[1], at the time of reading, is detected Low, then the data of memory cell M[1,1] is Low. In some embodiments, an eFuse E is closed when its resistance R is Low and is open when its resistance is High. The current used to burn (e.g., open/break) an eFuse E varies depending on the technologies. For example, in some embodiments related to 0.25 μm process technology node, current Ibls is in the range of 40 mA, while in the 0.4 μm node, current Ibls is in the range of 9-10 mA.

When a memory cell MC (e.g., memory cell MC[1,1]) is read, a transistor N (e.g., transistor N[1,1]) provides a current path for a current Isa (e.g., current Isa[1]) to flow through transistor N[1,1] (and footer F[1] to ground). When memory cell MC[1,1] is programmed, transistor N[1,1] is turned off so that current Isa[1] flows through the corresponding diode D[1,1]. In some embodiments, because in a reading mode, memory array 100 uses a low VDD voltage (e.g., VDD is about 1.8 V) and thus a low current Isa. The corresponding transistor N is therefore sized sufficient to handle current Isa, which is advantageous over other approaches wherein transistor N is used for both programming and reading.

When a memory cell MC is programmed, the corresponding diode D is used as a current path for the memory cell MC. For example, when memory cell MC[1,1] is programmed, transistor N[1,1] is turned off so that the programming current Ibsl[1] flows through diode D[1,1] (and footer F[1] to ground). In some embodiments, because the programming current Ibsl[1] is larger than the reading current Isa[1], diode D[1,1] is designed large enough to handle current Ibls[1]. In some embodiments, a transistor N is sized appropriate for reading while a diode D is sized appropriate for programming. As a result, the die size for a memory MC that includes a transistor N and a diode D is optimum. For example, a transistor (e.g., transistor N') that can handle the currents for both programming (e.g., current Ibsl) and reading (e.g., current Isa) could be much larger than the size of the combination of a transistor N and a diode D.

A word line WL controls (e.g., turns on or off) the corresponding plurality of transistors N in a row. For example, if a word line, e.g., word line WL[1] for row 1, is activated (e.g., applied with a High), word line WL[1] turns on all transistors N[1,1] to N[1,m] in row 1. But if word line WL[1] is deactivated, it turns off all transistors N[1,1] to N[1,m] in row 1.

A footer F serves as a current path for the plurality of memory cells MC in a row for both programming and reading the corresponding memory cell. For example, footer F[1] in row 1 serves as a current path for memory cells MC[1,1] to MC[1,m] in row 1, footer F[2] serves as a current path for memory cells MC[2,1] to MC[2,m] in row 2, and footer F[3] serves as a current path for memory cells MC[3,1] to MC[3,m] in row 3, etc. In some embodiments, a footer F (e.g., footer F[1]) is designed large enough to handle the larger of current Ibls (e.g., current Ibls[1]) used in programming and current Isa (e.g., current Isa[1]) used in reading.

A sense amplifier SA is used to read/sense the data in memory cells MC in a column. Further, in some embodiments, a sense amplifier SA, when appropriate, provides a High to a corresponding bit line BL that represents the High data to be read from a memory cell MC. A current Isa (e.g., current Isa[1]) generated by a corresponding sense amplifier SA (e.g., sense amplifier SA[1]) is used in reading data from a memory cell MC associated with the corresponding bit line BL (e.g., bit line BL[1]).

Figure 2:
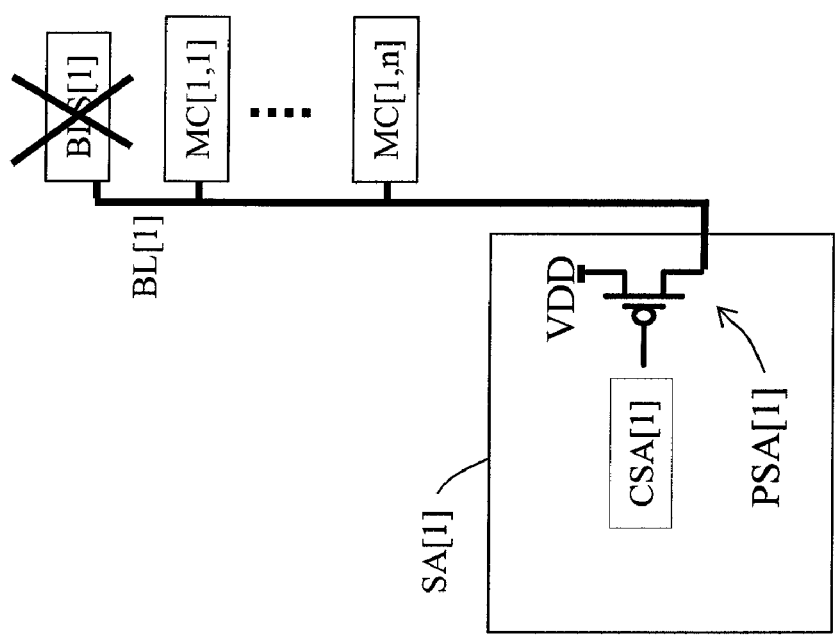
FIG. 2 is a diagram of a circuit illustrating how a sense amplifier provides a high logic level to a bit line in the memory array of FIG. 1, in accordance with some embodiments.

FIG. 2 is a diagram of a circuit 200 illustrating how sense amplifier SA[1] provides a High to the corresponding bit line BL[1], in accordance with some embodiments. As illustratively shown, bit line BL[1] couples transistor BLS[1], memory cells MC[1,1] to MC[1,n], and sense amplifier SA[1]. PMOS transistor PSA[1] is part of sense amplifier SA[1]. For simplicity, other circuitry of sense amplifier SA[1] is not shown. In some embodiments, at the time sense amplifier SA[1] provides the High to bit line BL[1], bit line BL[1] is floating, i.e., electrically disconnected from transistor BLS[1], which is illustratively shown as crossed out. Transistor PSA[1], when turned on, transfers the voltage level of voltage VDD from its source to its drain coupled to bit line BL[1] and thus pulls up bit line BL[1] to a High (e.g., voltage VDD). Signal CSA[1] applied at the gate of transistor PSA[1] controls transistor PSA[1]. For example, when signal CSA[1] is activated (e.g., driven with a Low), transistor PSA[1] turns on, but when signal CSA[1] is deactivated (e., driven with a High), transistor PSA[1] turns off. In some embodiments, the resistance of an eFuse (e.g., eFuse E[1,1]) is much lower than that off the resistance of PMOS transistor PSA[1].

Exemplary Operation

In some embodiments, after memory array 100 is manufactured, all eFuses E in memory array 100 are closed, i.e., all eFuse resistances are Low. When appropriate, an eFuse is programmed to be High by having a current flow through the eFuse to break the eFuse, i.e., to cause an open circuit or a High resistance value. To program an eFuse, the corresponding transistor BLS and Footer F are on, and the corresponding transistor N is off. For example, to program eFuse E[1,1], signal BLB[1] is activated to turn on transistor BLS[1], and signal Footer_WL[1] is activated to turn on footer F[1]. At the same time, signals Footer_WL[2] to Footer_WL[n] are off, which prevent current Ibls[1] from flowing through footers F[2] to F[n]. As a result, current Ibls[1], flows from the source of transistor BLS[1] through diode D[1,1], and transistor F[1,1] to ground. In some embodiments, transistors BLS are designed to provide the large current Ibls to break eFuses E. Similarly, diodes D are designed large enough to handle the current Ibls sufficient to break eFuses. In some embodiments, a current Ibls (e.g., current Ibls [1]), is in the range of 25 mA to 45 mA, diode D[1,1] has an area ranging from 4 to 8 $\mu m^2$.

In some embodiments, to read data from an eFuse E, the data is detected at the corresponding bit line BL. In that situation, the corresponding transistor BLS is turned off, and the corresponding sense amplifier SA, transistor N, and footer F are turned on. Depending on whether the eFuse is closed or open, the respective logic Low or High appears at the corresponding bit line BL, and is read therefrom. For example, to read data from memory cell MC[1,1], the data is read from bit line BL[1]; transistor BLS[1] is turned off; sense amplifier SA[1,1], transistor N[1,1], and footer F[1] are turned on. If eFuse[1,1] is open (e.g., High), sense amplifier SA[1] through transistor PSA[1] provides a High to bit line BL[1]. The read data is therefore High. If, however, eFuse[1,1] is closed (e.g., Low), current Isa[1] from sense amplifier SA[1] flows through eFuse E[1,1], transistor N[1,1] and footer F[1] to ground. Because NMOS transistor N[1,1] and footer F[1], also an NMOS transistor, are on, they pull the voltage level at bit line BL[1,1] to the level at the source of transistor F[1], which is ground or Low. In some embodiments, bit line BL[1] is raised by a voltage drop across eFuse[1,1], but this voltage is insignificant because the resistance value of eFuse[1,1] is small (e.g., about 100 Ohm) and current Isa[1] is also small (e.g., in the range of 500 μA to 1.5 mA). In some embodiments, transistor PSA[1] is designed such that current Isa[1] is small and insignificant to break eFuse[1,1].

Illustrative Methods

Figure 3:
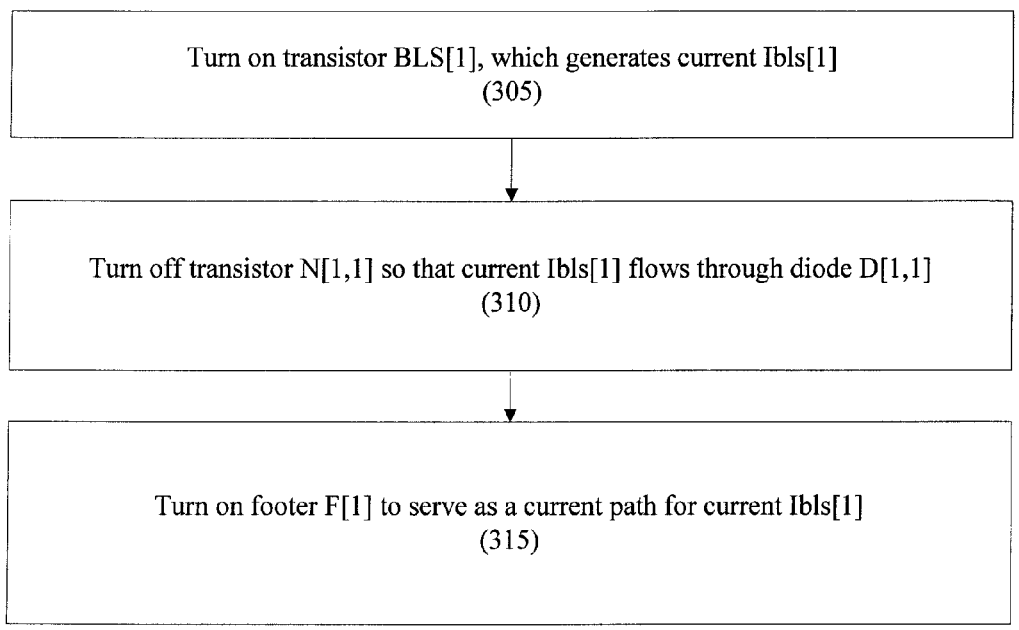
FIG. 3 is a flowchart illustrating a method of programming a memory cell of the memory array in FIG. 1, in accordance with some embodiments.

FIG. 3 is a flowchart 300 illustrating a method of programming a memory cell MC[1,1] in accordance with some embodiments. In effect, the method is to burn (e.g., break) eFuse E[1,1].

In step 305, transistor BLS[1] is turned on, which generates current Ibls[1]. Transistors BLS[2] to BLS[m] are turned off.

In step 310, transistor N[1,1] is turned off so that the current Ibls[1] that flows through eFuse E[1,1] flows through diode D[1,1].

In step 315, footer F[1] is turned on to serve as a current path for current Ibls[1] to break eFuse E[1,1]. Footers F[2] to F[n] are turned off to electrically disconnect memory cells MC[2,1] to MC[n,1] from bit line BL[1].

In the above steps, because current Ibsl[1] flows through eFuse E[1,1] (diode D[1,1], and footer F[1]) current Ibsl[1] breaks eFuse E[1,1]. As a result, eFuse E[1,1] changes the resistance or logic state from a Low to a High. In effect, memory cell MC[1,1] is programmed from a Low to a High.

Figure 4:
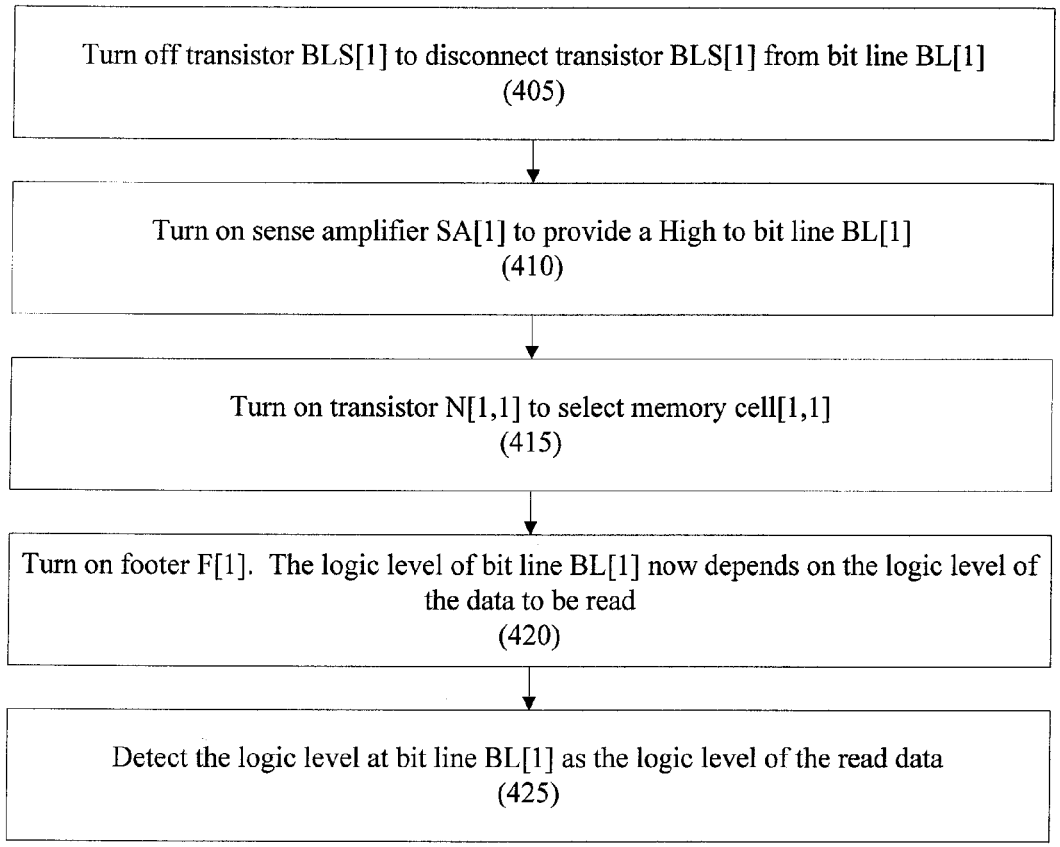
FIG. 4 is a flowchart illustrating a method of reading data from a memory cell of the memory array in FIG. 1, in accordance with some embodiments.

FIG. 4 is a flowchart 400 illustrating a method for reading data from memory cell M[1,1], in accordance with some embodiments.

In step 405, transistor BLS[1] is turned off and therefore electrically disconnected from bit line BL[1].

In step 410, sense amplifier SA[1] is turned on to provide a High to bit line BL[1].

In step 415, transistor N[1,1] is turned on to select memory cell MC[1,1].

In step 420, footer F[1] is turned on to provide a current path for current Isa[1] if eFuse E[1,1] is closed.

In the above steps, if eFuse[1,1] is open, bit line BL[1] remains at the High logic level provided by sense amplifier SA[1]. But if eFuse[1,1] is closed, current Isa[1] flows through eFuse E[1,1], transistor N[1,1] and footer[1]. As a result, the voltage level of bit line BL[1] is pulled to the voltage level at the source of footer/transistor F[1], which is ground or Low.

In step 425, the logic state of bit line BL[1] is detected (e.g., read), which represents the logic state of eFuse E[1,1] or the logic state or data of memory cell MC[1,1].

A number of embodiments have been described. It will nevertheless be understood that various modifications may be made without departing from the spirit and scope of the disclosure. For example, the various transistors being shown as a particular dopant type (e.g., NMOS and PMOS) are for illustration purposes, embodiments of the disclosure are not limited to a particular type, but the dopant type selected for a particular transistor is a design choice and is within the scope of embodiments. The logic level (e.g., Low or High) of the various signals used in the above description is also for illustration purposes, the disclosed embodiments are not limited to a particular level when a signal is activated and/or deactivated, but, rather, selecting such a level is a matter of design choice.

For another example, in some embodiments, a memory array comprises a plurality of rows and columns. A column includes a program control device, a plurality of eFuse memory cells in the column, a sense amplifier; and a bit line coupling the program control device, the plurality of memory cells in the column, and the sense amplifier. A row includes a plurality of eFuse memory cells in the row, a word line coupling the plurality of eFuse memory cells in the row, and a footer configured as a current path for the plurality of eFuse memory cells in the row. In some embodiments, when an eFuse memory cell in a respective row is read, a footer of the respective row of the memory array is configured to cause a read low logic level on a respective bit line.

For another example, in some embodiments, a memory array comprises: a plurality of eFuse memory cells arranged in rows and columns, a plurality of control devices, a plurality of bit lines, a plurality of sense amplifiers, and a plurality of word lines. At least one eFuse memory cell includes at least two current paths; a first current path configured for use in programming the at least one eFuse memory cell and a second current path configured for use in reading the at least one eFuse memory cell. A respective control device is associated with a respective column. A respective bit line is coupled to the respective control device associated with the respective column and to a plurality of respective eFuse memory cells in the respective column. A respective sense amplifier is coupled to the respective bit line coupled to the respective control device associated with the respective column. A respective word line is coupled to a plurality of respective eFuse memory cells in a respective row.

For another example, in some embodiments, a method for operating an eFuse memory cell in a column of a memory array, the eFuse memory cell having an eFuse coupled to at least two current paths, the method comprises: using a device coupled to the at least two current paths to serve as a current path for the at least two current paths; using a first current path of the at least two current paths and a first current value to program the eFuse memory cell; and using a second current path of the at least two current paths and a second current value to read data from the eFuse memory cell; the first current value being different from the second current value. In some embodiments, the method further comprises using a first current source and a second current source to generate the respective first current value and second current value; the first current source and the second current source coupled to a data line coupled to the memory cell.

The above methods show exemplary steps, but they are not necessarily performed in the order shown. Steps may be added, replaced, changed order, and/or eliminated as appropriate, in accordance with the spirit and scope of the disclosed embodiments.

What is claimed is:

1. A memory array comprising:
   a plurality of rows and columns;
   wherein a column includes
   a program control device;
   a plurality of eFuse memory cells in the column;
   a sense amplifier; and
   a bit line coupling the program control device, the plurality of eFuse memory cells in the column, and the sense amplifier; and
   a row includes
   a plurality of eFuse memory cells in the row;
   a word line coupling the plurality of eFuse memory cells in the row; and
   a footer configured as a current path for the plurality of eFuse memory cells in the row.

2. The memory array of claim 1 wherein an eFuse memory cell of at least one of the plurality of eFuse memory cells in the column or the plurality of eFuse memory cells in the row includes:
   an eFuse;
   an NMOS transistor; and
   a diode coupled in parallel with the NMOS transistor; the eFuse coupled in series with the NMOS transistor and the diode.

3. The memory array of claim 2 wherein:
   the NMOS transistor is configured for use in reading data from the eFuse memory cell; and
   the diode is configured for use in programming the eFuse memory cell.

4. The memory array of claim 1 wherein:
   an eFuse memory cell in a respective column includes:
   an eFuse; and
   at least two current paths, wherein
   a first current path of the at least two current paths is configured for use in a programming operation of the eFuse memory cell in the respective column, and
   a second current path of the at least two current paths is configured for use in a reading operation of the eFuse memory cell in the respective column.

5. The memory array of claim 1 wherein a program control device of a respective column is configured to provide a programming current to an eFuse memory cell of the respective column when the eFuse memory cell of the respective column is programmed.

6. The memory array of claim 1 wherein a sense amplifier of a respective column is configured to provide a reading current to an eFuse memory cell of the respective column when the eFuse memory cell of the respective column is read.

7. The memory array of claim 1 wherein, a sense amplifier of the respective column is configured to cause a read high logic level on a respective bit line, when an eFuse memory cell in a respective column is read.

8. The memory array of claim 1 wherein, a footer of the respective row is configured to cause a read low logic level on a respective bit line, when an eFuse memory cell in a respective row is read.

9. The memory array of claim 1 wherein, a footer of the respective row is configured to pull a logic level on a respective bit line to a logic level at a source of the footer of the respective row, when an eFuse memory cell in a respective row is read.

10. A memory array comprising:
    a plurality of eFuse memory cells arranged in rows and columns, at least one eFuse memory cell including at least two current paths, a first current path of the at least two current paths configured for use in programming the at least one eFuse memory cell and a second current path of the at least two current paths configured for use in reading the at least one eFuse memory cell;
    a plurality of control devices; a respective control device associated with a respective column, wherein the control device associated with the respective column serves as a common current path for the plurality of eFuse memory cells in the column;
    a plurality of bit lines; a respective bit line coupled to the respective control device associated with the respective column and to a plurality of respective eFuse memory cells in the respective column;
    a plurality of sense amplifiers; a respective sense amplifier coupled to the respective bit line coupled to the respective control device associated with the respective column; and
    a plurality of word lines; a respective word line coupled to a plurality of respective eFuse memory cells in a respective row.

11. The memory array of claim 10 further comprising a plurality of footers; a respective footer serving as a current path for the plurality of respective eFuse memory cells in the respective row.

12. A memory array comprising:
    a plurality of eFuse memory cells arranged in rows and columns, at least one eFuse memory cell including at least two current paths, a first current path of the at least two current paths configured for use in programming the at least one eFuse memory cell and a second current path of the at least two current paths configured for use in reading the at least one eFuse memory cell, wherein the first current path includes a diode and the second current path includes a transistor;
    a plurality of control devices; a respective control device associated with a respective column;
    a plurality of bit lines; a respective bit line coupled to the respective control device associated with the respective column and to a plurality of respective eFuse memory cells in the respective column;
    a plurality of sense amplifiers; a respective sense amplifier coupled to the respective bit line coupled to the respective control device associated with the respective column; and
    a plurality of word lines; a respective word line coupled to a plurality of respective eFuse memory cells in a respective row.

13. The memory array of claim 12 wherein the transistor is configured to a first state for use in programming the at least one eFuse memory cell and to a second state for use in reading the at least one eFuse memory cell.

14. A method for operating an eFuse memory cell in a column of a memory array, the method comprising:
    using a device coupled to at least two current paths that are coupled to an eFuse of the eFuse memory cell to serve as a current path for the at least two current paths;
    using a first current path of the at least two current paths and a first current value to program the eFuse memory cell; and
    using a second current path of the at least two current paths and a second current value to read data from the eFuse memory cell; the first current value being different from the second current value.

15. The method of claim 14 further comprising using a first current source and a second current source to generate the respective first current value and the respective second current value, the first current source and the second current source coupled to a data line coupled to the eFuse memory cell.

16. The method of claim 15 further comprising using a PMOS transistor as the first current source.

17. The method of claim 15 further comprising using a sense amplifier as the second current source.

18. The method of claim 14 further comprising using a diode in the first current path and using an NMOS transistor in the second current path.

19. The method of claim 14 wherein the device is an NMOS transistor.

20. The method of claim 14 further comprising using the device to serve as a current path for a plurality of eFuse memory cells in a same row of the memory array.

* * * * *